(12) United States Patent
Itoh et al.

(10) Patent No.: US 10,061,461 B2
(45) Date of Patent: Aug. 28, 2018

(54) TRANSPARENT ELECTROCONDUCTIVE LAMINATE AND TRANSPARENT TOUCH PANEL USING THE SAME

(75) Inventors: Haruhiko Itoh, Hino (JP); Koichi Imamura, Tokyo (JP)

(73) Assignees: TEIJIN LIMITED, Osaka (JP); TEIJIN CHEMICALS LIMITED, Tokyo (JP)

( * ) Notice: Subject to any disclaimer, the term of this patent is extended or adjusted under 35 U.S.C. 154(b) by 290 days.

(21) Appl. No.: 13/142,335

(22) PCT Filed: Sep. 17, 2009

(86) PCT No.: PCT/JP2009/066298
§ 371 (c)(1),
(2), (4) Date: Sep. 23, 2011

(87) PCT Pub. No.: WO2010/073781
PCT Pub. Date: Jul. 1, 2010

(65) Prior Publication Data
US 2012/0032900 A1 Feb. 9, 2012

(30) Foreign Application Priority Data

Dec. 26, 2008 (JP) .................. 2008-335212
Mar. 3, 2009 (JP) .................. 2009-049558
Mar. 30, 2009 (JP) .................. 2009-083633

(51) Int. Cl.
*G06F 3/041* (2006.01)
*B32B 27/20* (2006.01)
(Continued)

(52) U.S. Cl.
CPC .............. *G06F 3/045* (2013.01); *C08J 7/045* (2013.01); *C23C 14/086* (2013.01);
(Continued)

(58) Field of Classification Search
CPC ..... Y10T 428/24363; Y10T 428/24364; Y10T 428/24372; Y10T 428/24413; G06F 3/045;
(Continued)

(56) References Cited

U.S. PATENT DOCUMENTS

2002/0154100 A1  10/2002  Hatakeda et al.
2009/0315849 A1*  12/2009  Ito .................................. 345/173

FOREIGN PATENT DOCUMENTS

EP    1 691 375 A1   8/2006
EP    1 930 803 A1   6/2008
(Continued)

OTHER PUBLICATIONS

K. W. Suh, et al., "Cohesive Energy Densities of Polymers from Turbidimetric Titrations," Journal of Polymer Science, 1967, pp. 1671-1681, vol. 5, Part A-1.

(Continued)

*Primary Examiner* — Nancy R Johnson
(74) *Attorney, Agent, or Firm* — Sughrue Mion, PLLC

(57) ABSTRACT

Provided is a transparent electroconductive laminate which can prevent the occurrence of Newton rings between two transparent electrode substrates constituting a transparent touch panel. Also provided is a transparent touch panel which comprises the transparent electroconductive laminate. A transparent electroconductive laminate (14, 15, 16) comprises a transparent organic polymer substrate (16), and comprises an uneven-surfaced hardened resin layer (15) and a transparent electroconductive layer (14) which are successively laminated on at least one side of the transparent organic polymer substrate. The transparent electroconductive laminate is characterized in that the hardened resin layer comprises a hardening resin component and at least one of ultrafine metal oxide particles (A) and ultrafine metal fluo- (Continued)

ride particles (B), these particles having an average primary particle diameter of 100 nm or less and being dispersed in the hardening resin component. The contents of the ultrafine particles (A) and (B) in the hardened resin layer are each 1 part by mass or more to less than 20 parts by mass per 100 parts by mass of the hardening resin component. The ratio by mass (A/B) of the ultrafine particles (A) to the ultrafine particles (B) is greater than 0.3. A transparent touch panel (20) comprises the aforesaid transparent electroconductive laminate (14, 15, 16).

20 Claims, 4 Drawing Sheets

(51) Int. Cl.
  *B32B 7/02* (2006.01)
  *B32B 9/00* (2006.01)
  *G06F 3/045* (2006.01)
  *C23C 14/08* (2006.01)
  *C08J 7/04* (2006.01)

(52) U.S. Cl.
  CPC ........ *C08J 2367/02* (2013.01); *C08J 2369/00* (2013.01); *C08J 2433/06* (2013.01); *Y10T 428/24364* (2015.01)

(58) Field of Classification Search
  CPC ... G02B 1/10; G02B 1/14; G02B 5/02; G02B 5/021; C08J 7/045; C08J 2433/06; C08J 2369/00; C08J 2367/02; C23C 14/086
  USPC .............................. 428/141, 143, 148, 149
  See application file for complete search history.

(56) References Cited

FOREIGN PATENT DOCUMENTS

| | | |
|---|---|---|
| EP | 2 109 116 A1 | 10/2009 |
| JP | 10-323931 A | 12/1998 |
| JP | 2002-275391 A | 9/2002 |
| JP | 2002-373056 A | 12/2002 |
| JP | 2004-195898 A | 7/2004 |
| JP | 2004-351744 A | 12/2004 |
| JP | 2005-209431 A | 8/2005 |
| JP | 2006-056136 A | 3/2006 |
| JP | 2006-190512 A | 7/2006 |
| WO | 2005/073763 A1 | 8/2005 |
| WO | 2008/088059 A1 | 7/2008 |

OTHER PUBLICATIONS

European Search Report dated Apr. 5, 2013 for European Application No. 09 83 4587.

\* cited by examiner

TRANSPARENT ELECTROCONDUCTIVE LAMINATE AND TRANSPARENT TOUCH PANEL USING THE SAME

TECHNICAL FIELD

The present invention relates to a transparent touch panel and a transparent electroconductive laminate suitable therefor. More specifically, the present invention relates to a transparent touch panel with excellent visibility and a transparent electroconductive laminate used therefor.

BACKGROUND ART

Recently, many transparent touch panels capable of enabling an interactive input system have been put into use. The transparent touch panel includes, for example, an optical system, an ultrasonic system, a capacitance system and a resistance film system, according to the position-sensing system. Of these, the resistance film system has a simple structure and excellent price/performance ratio, and therefore has gained widespread use in recent years.

The touch panel of a resistance film system is an electronic component fabricated by holding two films or sheets having respective transparent electroconductive layers on the opposing sides with a constant distance therebetween, wherein a movable electrode substrate (electrode substrate on the viewing side) is pressed with a pen or a finger to sag and cause contact and electrical conduction with a fixed electrode substrate (electrode substrate on the opposite side), and a sensor circuit is then allowed to detect the position, thereby effecting a predetermined input. At this time, an interference fringe called a Newton ring sometimes appears around the pressed part. Also, even in a non-pressed state, a Newton ring may appear in a portion where the distance between the movable electrode substrate and the fixed electrode substrate is decreased due to sagging of the movable electrode substrate. The generation of a Newton ring impairs the visibility of a display.

In order to reduce the Newton ring that may be generated between two transparent electrode substrates constituting such a transparent touch panel of a resistance film system, a method of forming an unevenness with an appropriate shape and an appropriate size on the film surface is effective. Specifically, there are disclosed a method where a coating layer containing a predetermined amount of a filler having an average primary particle diameter of 1 to 4 µm and a transparent electroconductive layer formed on a plastic film (see, Japanese Unexamined Patent Publication No. 10-323931), and a method where a projected coating layer (coating layer having projections) containing silica particles having an average secondary particle diameter of 1.0 to 3.0 µm is formed on a plastic film (see, Japanese Unexamined Patent Publication No. 2002-373056).

In the case of a touch panel using a transparent electroconductive laminate where, as described above, a coating layer containing particles having an average primary particle diameter or average secondary particle diameter of about several microns and a transparent electroconductive layer are formed on a plastic film, the generation of a Newton ring is reduced. However, when this transparent touch panel is installed on a high-definition display, the resin around a particle in the coating layer above exerts a lens effect to cause a problem that color separation (sparkling) of light coming from the display occurs and then the visibility of the display is seriously impaired.

As other coating layers for reducing the Newton ring, there is disclosed a method where inorganic fine particles having an average primary particle diameter of 100 nm or less are added to a cured resin containing inorganic fine particles having an average primary particle diameter of 0.5 to 5 µm, whereby the unevenness profile is controlled, and the generation of a Newton ring and the impairment of visibility due to sparkling are reduced simultaneously (see, Japanese Unexamined Patent Publication No. 2006-190512). However, the anti-Newton ring layer formed by this method has a problem that when a test of sliding durability or edge-pressing durability required of a touch panel is performed, the transparent electroconductive layer starts deteriorating and separating from the projection portion formed by the inorganic fine particle, and the electrical characteristics as a touch panel are degraded at the end.

Also, when a hitting durability test is performed, the projection formed by the inorganic fine particle contained in the transparent electroconductive layer-forming surface of the movable electrode substrate destroys a dot spacer formed on the fixed electrode substrate to scatter broken pieces in the touch panel. The thus-scattered broken pieces of the dot spacer disadvantageously prevent the electric connection between the movable electrode substrate and the fixed electrode substrate, and deteriorate the electrical characteristics of the touch panel. Furthermore, there is a problem that the scattered broken pieces of the dot spacer adhere to and damage the transparent electroconductive layers of the movable electrode substrate, and the fixed electrode substrate and the electrical characteristics of the touch panel are degraded.

In addition, when such an anti-Newton ring layer formed using inorganic fine particles is used as a fixed electrode substrate, there is also a problem that the projection formed by the inorganic fine particle damages the transparent electroconductive layer of the movable electrode substrate, and the electrical characteristics of the touch panel are degraded. Also, when a resin layer containing fine particles of about several µm is formed by wet coating using a gravure coater or the like, fine particles in the coating solution precipitate with aging, and this requires frequent change of the coating solution, which results in a problem in the productivity.

As the method of not using an inorganic fine particle of 1 µm or more to form an unevenness profile on the film surface, for example, a thermoplastic resin and an inorganic fine particle having an average primary particle diameter of 0.001 µm to less than 1 µm are combined with a compound polymerizable upon irradiation with an activation energy ray or an oligomer thereof, but in a layer formed by such a technique, the haze becomes extremely high, and thereby the visibility of a display is impaired (see, Japanese Unexamined Patent Publication No. 2002-275391).

Also, a method where ultrafine particles having an average primary particle diameter of 100 nm or less are dispersed as an aggregate of less than 1.0 µm or in a state of not forming an aggregate in a cured resin layer to form an unevenness profile is disclosed, but the unevenness of an anti-Newton ring layer formed by such a technique is small, and when the pressing pressure is strong, a Newton ring is observed (see, Japanese Unexamined Patent Publication Nos. 2006-056136, 2005-209431, 2004-351744 and 2004-195898).

SUMMARY OF THE INVENTION

Problems to be Solved by the Invention

An object of the present invention is to provide a transparent electroconductive laminate for transparent touch panels, ensuring that even when a transparent touch panel is installed on a high-definition display, the visibility is kept from deterioration due to sparkling, and a Newton ring generated between two transparent electrode substrates constituting the transparent touch panel can be prevented.

Another object of the present invention is to provide a transparent electroconductive laminate capable of maintaining the visibility and giving good productivity.

Still another object of the present invention is to provide a novel transparent touch panel using the above-described transparent electroconductive laminate.

Means to be Solve the Problems

As a result of extensive studies on a surface roughening technique using an ultrafine particle so as to attain the objects above, the present inventors have found that when a metal oxide ultrafine particle and a metal fluoride ultrafine particle are mixed and used in a specific ratio, the metal oxide ultrafine particle and the metal fluoride ultrafine particle create a weakly aggregated state in a cured resin layer to form a desired unevenness profile (first embodiment of the present invention). Also, the present inventors have found that when a metal oxide ultrafine particle and a metal fluoride ultrafine particle are mixed and used in a specific ratio, and at the same time, the cured resin layer is formed to a specific thickness, the metal oxide ultrafine particle and the metal fluoride ultrafine particle create a weakly aggregated state in the cured resin layer to form a desired unevenness profile, and thereby enable obtaining desired anti-Newton ring property, image sharpness and sparkling resistance (second embodiment of the present invention). Furthermore, the present inventors have found that when a metal oxide ultrafine particle and a metal fluoride ultrafine particle are mixed and used in a specific ratio, the metal oxide ultrafine particle and the metal fluoride ultrafine particle create a weakly aggregated state in a cured resin layer to form a desired unevenness profile, and when the cured resin component constituting the cured resin layer contains at least two kinds of resin components undergoing phase separation based on the difference in physical properties, the formation of the unevenness profile can be further controlled to enable obtaining desired anti-Newton ring property, image sharpness and sparkling resistance (third embodiment of the present invention).

First Embodiment of the Present Invention

The transparent electroconductive laminate in the first embodiment of the present invention is a transparent electroconductive laminate comprising a cured resin layer with an uneven surface and a transparent electroconductive layer stacked in order on at least one surface of a transparent organic polymer substrate, and satisfying the following requirements (a) to (d):

(a) the cured resin layer contains a cured resin component and contains a metal oxide ultrafine particle A having an average primary particle diameter of 100 nm or less and a metal fluoride ultrafine particle B having an average primary particle diameter of 100 nm or less, which are dispersed in the cured resin component, (b) the content of the metal oxide ultrafine particle A in the cured resin layer is from 1 part by mass to less than 20 parts by mass per 100 parts by mass of the cured resin component, (c) the content of the metal fluoride ultrafine particle B in the cured resin layer is from 1 part by mass to less than 20 parts by mass per 100 parts by mass of the cured resin component, and (d) the mass ratio (A/B) of the metal oxide ultrafine particle A to the metal fluoride ultrafine particle B in the cured resin layer is more than 0.3.

Second Embodiment of the Present Invention

The transparent electroconductive laminate in the second embodiment of the present invention is a transparent electroconductive laminate comprising a cured resin layer with an uneven surface and a transparent electroconductive layer stacked in order on at least one surface of a transparent organic polymer substrate, and satisfying the following requirements (a) to (e):

(a) the cured resin layer contains a cured resin component, and contains a metal oxide ultrafine particle A having an average primary particle diameter of 100 nm or less and a metal fluoride ultrafine particle B having an average primary particle diameter of 100 nm or less, which are dispersed in the cured resin component, (b) the content of the metal oxide ultrafine particle A in the cured resin layer is from 1 part by mass to less than 20 parts by mass per 100 parts by mass of the cured resin component, (c) the content of the metal fluoride ultrafine particle B in the cured resin layer is from 1 part by mass to less than 20 parts by mass per 100 parts by mass of the cured resin component, (d) the mass ratio (A/B) of the metal oxide ultrafine particle A to the metal fluoride ultrafine particle B in the cured resin layer is from 0.5 to 2.0, and (e) the film thickness of the cured resin layer is from 0.15 µm to less than 1.0 µm.

Third Embodiment of the Present Invention

The transparent electroconductive laminate in the third embodiment of the present invention is a transparent electroconductive laminate comprising a cured resin layer with an uneven surface and a transparent electroconductive layer stacked in order on at least one surface of a transparent organic polymer substrate, and satisfying the following requirements (a) to (e):

(a) the cured resin layer contains a cured resin component and contains a metal oxide ultrafine particle A having an average primary particle diameter of 100 nm or less and a metal fluoride ultrafine particle B having an average primary particle diameter of 100 nm or less, which are dispersed in the cured resin component, (b) the content of the metal oxide ultrafine particle A in the cured resin layer is from 1 part by mass to less than 20 parts by mass per 100 parts by mass of the cured resin component, (c) the content of the metal fluoride ultrafine particle B in the cured resin layer is from 1 part by mass to less than 20 parts by mass per 100 parts by mass of the cured resin component, (d) the mass ratio (A/B) of the metal oxide ultrafine particle A to the metal fluoride ultrafine particle B in the cured resin layer is from more than 0.3 to less than 10, and (e) the cured resin component contains at least two kinds of resin components undergoing phase separation based on the difference in physical properties.

Effects of the Invention

According to the present invention, a transparent electroconductive laminate for transparent touch panels is provided, wherein the transparent electroconductive laminate ensures that, even when a transparent touch panel is installed on a high-definition display, the visibility is kept from deterioration due to sparkling, and that a Newton ring generated between two transparent electrode substrates constituting the transparent touch panel can be prevented. Particularly, in the second and third embodiments of the transparent electroconductive laminate of the present invention, high image sharpness can be ensured not only in the vertical direction but also in the oblique direction. Also, according to the present invention, a display and an optical electronic component each fabricated using the transparent electroconductive laminate of the present invention are provided.

More specifically, in the case of use as an optical electronic component, the transparent electroconductive laminate of the present invention reduces a Newton ring while preventing color separation (sparkling) of a pixel even when applied to a high-definition display. Especially, in the second and third embodiments of the present invention, enables balanced optical characteristics of high image sharpness at wide angles. The transparent electroconductive laminate of the present invention is applicable as a new functional touch panel substrate having excellent visibility unrealizable by conventional techniques.

Also, the transparent touch panel using the transparent electroconductive laminate of the present invention can be prevented from color separation (sparkling) of a pixel on a high-definition display body while suppressing a Newton ring generated between a movable electrode substrate and a fixed electrode substrate and particularly. Especially, in the second and third embodiments of the present invention, the transparent electroconductive laminate of the present invention can give a high image sharpness at wide angles.

Furthermore, the transparent electroconductive laminate of the present invention can reduce the frequency with which the coating solution is changed at the production.

MODE FOR CARRYING OUT THE INVENTION

The embodiments of the present invention are described below, but the present invention is not limited to the following descriptions.

Figure 3:
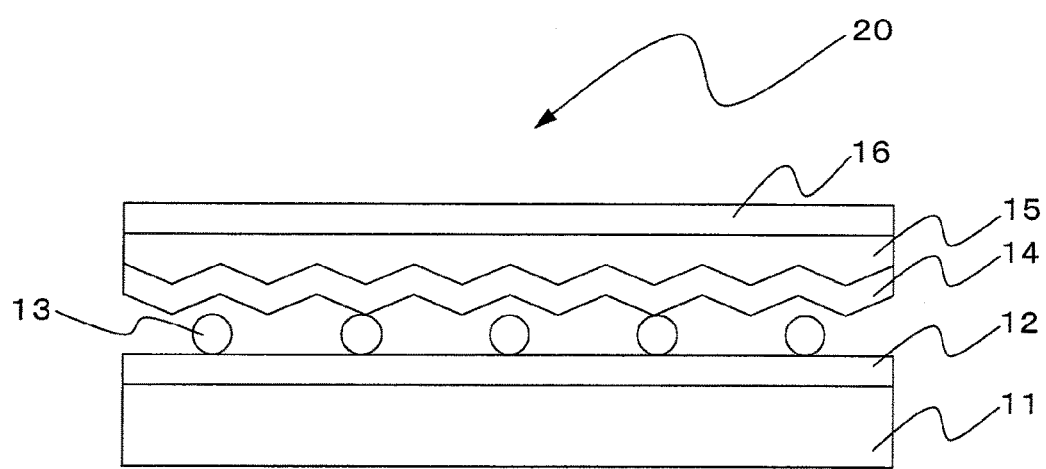
[FIG. 3] A view showing an example of a transparent touch panel having the transparent electroconductive laminate of the present invention.

The transparent electroconductive laminate of the present invention is a transparent electroconductive laminate comprising a cured resin layer with an uneven surface and a transparent electroconductive layer stacked in order on at least one surface of a transparent organic polymer substrate. One embodiment of the transparent electroconductive laminate of the present invention is a transparent electroconductive laminate where, as shown in FIG. 3, a cured resin layer (15) with an uneven surface and a transparent electroconductive layer (14) are stacked in order on at least one surface of a transparent organic polymer substrate (16). In one embodiment of the electroconductive laminate of the present invention shown in FIG. 3, the transparent electroconductive laminate (14, 15, 16) of the present invention and another substrate (11) such as glass plate having a transparent electroconductive layer (12) are disposed by arranging respective transparent electroconductive layers (12, 14) to face each other, and a spacer (13) is disposed therebetween, whereby a transparent touch panel (20) can be formed.

<Transparent Organic Polymer Substrate>

The transparent organic polymer substrate used in the transparent electroconductive laminate of the present invention may be an arbitrary transparent organic polymer substrate, particularly a transparent organic polymer substrate excellent in the heat resistance, transparency and the like, which is employed in the optical field.

The transparent organic polymer substrate used in the transparent electroconductive laminate of the present invention includes, for example, a substrate composed of a transparent polymer such as a polyester-based polymer, e.g., polyethylene terephthalate and polyethylene naphthalate; a polycarbonate-based polymer; a cellulose-based polymer, e.g., diacetyl cellulose and triacetyl cellulose; and an acrylic polymer, e.g., polymethyl methacrylate. The transparent organic polymer substrate used in the transparent electroconductive laminate of the present invention also includes a substrate composed of a transparent polymer such as a styrene-based polymer, e.g., polystyrene and acrylonitrile-styrene copolymer; an olefin-based polymer, e.g., polyethylene, polypropylene, polyolefin having a cyclic or norbornene structure, and ethylene-propylene copolymer; a vinyl chloride-based polymer; and an amide-based polymer typified by nylon and aromatic polyamide. Other examples of the transparent organic polymer substrate used in the transparent electroconductive laminate of the present invention include a substrate composed of a transparent polymer such as imide-based polymer, sulfone-based polymer, polyethersulfone-based polymer, polyether ether ketone-based polymer, polyphenylene sulfide-based polymer, vinyl alcohol-based polymer, vinylidene chloride-based polymer, vinyl butyral-based polymer, allylate-based polymer, polyoxymethylene-based polymer, epoxy-based polymer and a blend of these polymers.

For use in the transparent electroconductive laminate of the present invention, out of these transparent organic polymer substrates, those in which the birefringence is optically low, the birefringence is controlled to λ/4 or λ/2, or the birefringence is not controlled at all, may be appropriately selected according to usage. In performing appropriate selection according to usage as described above, the transparent electroconductive laminate of the present invention may be used, for example, as a polarizing plate or a retardation film used in a liquid crystal display or as a display member developing its function through polarization such as linear polarization, elliptical polarization and circular polarization, like an inner touch panel.

The film thickness of the transparent polymer substrate may be appropriately determined but generally, in view of strength, workability such as handleability and the like, the film thickness is approximately from 10 to 500 μm, preferably from 20 to 300 μm, more preferably from 30 to 200 μm.

<Cured Resin Layer>

The cured resin layer with an unevenness profile used in the transparent electroconductive laminate of the present invention contains a cured resin component, and contains at least one kind of a metal oxide ultrafine particle A having an average primary particle diameter of 100 nm or less and a metal fluoride ultrafine particle B having an average primary particle diameter of 100 nm or less, which are dispersed in the cured resin component.

<Cured Resin Layer—Cured Resin Component>

First and Second Embodiments

With respect to the first and second embodiments of the present invention, as the curable resin component, those allowing for dispersion of ultrafine particles having an average primary particle diameter of 100 nm or less and having sufficient strength and transparency as a film after forming the cured resin layer can be used without any particular limitation. The examples thereof include an ionizing radiation-curable resin and a thermosetting resin.

Examples of the monomer that gives the ionizing radiation curable resin include monofunctional and polyfunctional acrylates such as polyol acrylate, polyester acrylate, urethane acrylate giving a hard layer other than those described above, epoxy acrylate, modified styrene acrylate, melamine acrylate, and silicon-containing acrylate.

Specific examples of the monomer that gives the ionizing radiation-curable resin include polyfunctional monomers such as trimethylolpropane trimethacrylate, trimethylolpropane ethylene oxide-modified triacrylate, trimethylolpropane propylene oxide-modified triacrylate, isocyanuric acid alkylene oxide-modified acrylate, pentaerythritol triacrylate, dipentaerythritol hexaacrylate, dimethyloltricyclodecane diacrylate, tripropylene glycol triacrylate, diethylene glycol diacrylate, 1,6-hexanediol diacrylate, epoxy-modified acrylate, urethane-modified acrylate and epoxy-modified acrylate.

One of these monomers capable of providing the ionizing radiation-curable resin may be used alone, a mixture of several kinds of monomers may be used, or depending on the case, a hydrolysate of various alkoxysilanes may be added in an appropriate amount. In the case of performing the polymerization of the resin layer by ionizing radiation, an appropriate amount of a photopolymerization initiator is generally added and, if desired, an appropriate amount of a photosensitizer may be added. Examples of the photopolymerization initiator include acetophenone, benzophenone, benzoin, benzyl benzoate and thioxanthone, and examples of the photosensitizer include triethylamine and tri-n-butylphosphine.

Examples of the thermosetting resin include an organosilane-based thermosetting resin using, as the monomer, a silane compound such as methyltriethoxysilane and phenyltriethoxysilane; a melamine-based thermosetting resin using, as the monomer, an etherified methylolmelanmine; an isocyanate-based thermosetting resin; a phenolic thermosetting resin; and an epoxy thermosetting resin. One of these thermosetting resins may be used alone, or a plurality thereof may be used in combination. Also, a thermoplastic resin may be mixed with the thermosetting resin, if desired.

In the case of performing the crosslinking of the resin layer by heat, a reaction promoter and/or a curing agent may be added in an appropriate amount. Examples of the reaction promoter include triethyldiamine, dibutyltin dilaurate, benzylmethylamine and pyridine. Examples of the curing agent include methylhexahydrophthalic anhydride, 4,4'-diaminodiphenylmethane, 4,4'-diamino-3,3'-diethyldiphenylmethane and diaminodiphenylsulfone.

Incidentally, the cured resin layer may contain a third component such as leveling agent and photosensitizer.

Third Embodiment

With respect to the third embodiment of the present invention, as the curable resin component, those containing at least two kinds of resin components undergoing phase separation based on the difference in physical properties, allowing for dispersion of ultrafine particles having an average primary particle diameter of 100 nm or less, and having sufficient strength and transparency as a film after forming the cured resin layer can be used without any particular limitation. Examples thereof include an ionizing radiation-curable resin and a thermosetting resin.

As for at least two kinds of resin components undergoing phase separation based on the difference in physical properties, for example, International Patent Publication No. WO2005/073763 may be referred to.

For example, as described in International Patent Publication No. WO2005/073763, when the at least two kinds of resin components undergoing phase separation based on the difference in physical properties are coated on a transparent organic polymer substrate to form a cured resin layer, the first resin component and the second resin component undergo phase separation based on the difference in physical properties of the first and second resin components, whereby a resin layer having a random unevenness on the surface is formed. By combining this unevenness formed by the first and second resin components with the formation of an uneven surface by a combination of the later-described metal oxide ultrafine particle A and metal fluoride ultrafine particle B, the uneven surface can be controlled at a higher level.

Specific first and second resin components each can be independently selected from the group consisting of monomers, oligomers and resins.

In order to allow the first resin component and the second resin component to undergo phase separation based on the difference in physical properties of the first and second resin components, the difference in the value of a specific physical property between the first resin component and the second resin component, for example, the difference in the value such as SP value (solubility parameter), glass transition temperature (Tg), surface tension and/or number average molecular weight, can be made to have a given magnitude. The first and second resin components may be used in a ratio of 1:99 to 99:1, preferably from 1:99 to 50:50, more preferably from 1:99 to 20:80.

First and Second Components—SP Value

In the case where phase separation of the first resin component from the second resin component is brought about by the difference in the SP value (solubility parameter), the difference between the SP value of the first resin component and the SP value of the second resin component is preferably 0.5 or more, more preferably 0.8 or more. The upper limit of the difference in the SP value is not particularly limited but is generally 15 or less. When the difference between the SP value of the first resin component and the SP value of the second resin component is 0.5 or more, compatibility between respective resins is low and in turn, phase separation of the first resin component from the second resin component is considered to be brought about after the coating of the coating composition.

Incidentally, as for the SP value, a larger numerical value indicates higher polarity, and a smaller numerical value indicates lower polarity. In the present invention, the SP value is measured by the method described in SUH, CLARKE, J. P. S. A-1, 5, 1671-1681 (1967), and International Patent Publication No. WO2005/073763 cited in the publication above.

In this case, as an example of the first and second resin components, the first resin component is an oligomer or a resin and the second resin component is a monomer. The oligomer or resin as the first resin component is preferably an unsaturated double bond-containing acrylic copolymer, and the monomer as the second resin component is preferably a polyfunctional unsaturated double bond-containing monomer. The term "oligomer" as used in the description of the present invention indicates a polymer having a repeating unit, where the number of the repeating units is from 3 to 10.

As another example of the first and second resin components, the first and second resin components both are an oligomer or a resin. The first and second resin components are preferably a resin containing a (meth)acrylic resin in the framework structure. The first resin component is more preferably an unsaturated double bond-containing acrylic copolymer, and the second resin component is more preferably a polyfunctional unsaturated double bond-containing monomer.

The coating composition for the cured resin layer of the present invention may further contain an organic solvent. Preferred examples of the organic solvent include a ketone-based solvent such as methyl ethyl ketone, an alcohol-based solvent such as methanol, and an ether-based solvent such as anisole. One of these solvents may be used alone, or two or more kinds of organic solvents may be mixed and used.

First and Second Resin Components—Glass Transition Temperature (Tg)

In the case where phase separation of the first resin component from the second resin component is brought about by the difference in the glass transition temperature (Tg), it is preferred that either one of the first and second resin components has Tg lower than the ambient temperature at the coating of the coating composition and the other has Tg higher than the ambient temperature at the coating of the coating composition. In this case, the resin having Tg higher than the ambient temperature is in a glassy state of inhibiting molecular motion at that ambient temperature and therefore, the resin aggregates in the coating composition after coating, whereby phase separation of the first resin component from the second resin component is considered to be brought about.

First and Second Resin Components—Surface Tension

In the case where phase separation of the first resin component from the second resin component is brought about by the difference in the surface tension, the difference between the surface tension of the first resin component and the surface tension of the second resin component is preferably from 1 to 70 dyn/cm, and this difference is more preferably from 5 to 30 dyn/cm. When the difference in the surface tension is in this range, a resin having a higher surface tension tends to aggregate and in turn, phase separation of the first resin component from the second resin component is considered to be brought about after the coating of the coating composition.

Incidentally, the surface tension can be determined by obtaining the static surface tension measured by a ring method using Dynometer manufactured by Byk Chemie.

<Cured Resin Layer—Ultrafine Particle>

(Material)

The metal oxide ultrafine particle A having an average primary particle diameter of 100 nm or less blended in the cured resin is substantially no limited. At least one member selected from the group consisting of $Al_2O_3$, $Bi_2O_3$, $CeO_2$, $In_2O_3$, $In_2O_3.SnO_2$, $HfO_2$, $La_2O_3$, $Sb_2O_5$, $Sb_2O_5.SnO_2$, $SiO_2$, $SnO_2$, $TiO_2$, $Y_2O_3$, $ZnO$ and $ZrO_2$ can be suitably used, and $Al_2O_3$ or $SiO_2$ can be more suitably used. Also, the metal oxide ultrafine particle A may have an average primary particle diameter of 100 nm or less, 90 nm or less, 80 nm or less, 70 nm or less, 60 nm or less, or 50 nm or less.

As the metal fluoride ultrafine particle B having an average primary particle diameter of 100 nm or less blended in the cured resin, $MgF_2$ is suitably used, but the present invention is not limited thereto. The metal fluoride ultrafine particle B may have an average primary particle diameter of 100 nm or less, 90 nm or less, 80 nm or less, 70 nm or less, 60 nm or less, or 50 nm or less.

(Dispersed State)

The cured resin layer forming an unevenness profile for use in the invention is required to keep good visibility even when installed on a high-definition display, but if the metal oxide ultrafine particle A and/or metal fluoride ultrafine particle B form a distinct aggregate larger than an optical wavelength, sparkling is increased and the visibility is impaired. On the other hand, if the metal oxide ultrafine particle A and the metal fluoride ultrafine particle B are dispersed in a substantially homogeneous manner, the height of the unevenness formed is decreased, and a Newton ring generated between two transparent electrode substrates constituting a transparent touch panel cannot prevented extreme reduction in visibility on actual use.

Accordingly, in the transparent electroconductive laminate of the present invention, the metal oxide ultrafine particle A and the metal fluoride ultrafine particle B are preferably kept from forming a secondary aggregate or secondary particle of 1 μm or more, more preferably from forming a secondary aggregate or secondary particle larger than an optical wavelength, for example, a secondary aggregate or secondary particle of 600 nm or more. However, the ultrafine particles may be dispersed in a state where the metal oxide ultrafine particle A and/or metal fluoride ultrafine particle B having an average primary particle diameter of 100 nm or less form a secondary aggregate of less than an optical wavelength.

In the transparent electroconductive laminate of the present invention, the metal oxide ultrafine particle A and the metal fluoride ultrafine particle B preferably create a weakly aggregated state to form surface unevenness with an appropriate profile.

(Blending Ratio)

First and Third Embodiments

In the first and third embodiments of the present invention, as for the blending ratio of those ultrafine particles when dispersing them in the cured resin, each of the metal oxide ultrafine particle A and the metal fluoride ultrafine particle B must be from 1 part by mass to less than 20 parts by mass per 100 parts by mass of the cured resin composition, and the blending ratio is preferably from 1 to 15 parts by mass, more preferably from 1 to 10 parts by mass. If the ratio of the metal oxide ultrafine particle A and/or metal fluoride ultrafine particle B is too small, a resin layer having surface unevenness required in the use of the present invention can be hardly formed, whereas if the ratio is excessively large, the proportion of the cured resin component decreases and this makes it difficult to have sufficient strength as a film after forming the cured resin layer.

In order to form a cured resin layer with sufficiently large unevenness, the mass ratio (A/B) of the metal oxide ultrafine particle A to the metal fluoride ultrafine particle B must be more than 0.3, and this ratio is preferably from more than 0.3 to 10.0, more preferably from more than 0.3 to 5.0.

Second Embodiment

In the second embodiment of the present invention, for forming a cured resin layer with sufficiently large unevenness, the mass ratio (A/B) of the metal oxide ultrafine particle A to the metal fluoride ultrafine particle B must be from 0.5 to 2.0 (that is, 0.5 or more and at the same time, 2.0 or less), and this ratio is preferably from 0.8 to 2.0, more preferably from 0.8 to 1.7. If this ratio is excessively large or small, an unevenness profile desired in the second embodiment of the present invention cannot be formed on the cured resin layer surface.

<Cured Resin Layer—Film Thickness>

First Embodiment

In the first embodiment of the present invention, the film thickness of the cured resin layer with surface unevenness is preferably from 0.1 to 4.5 µm, more preferably from 0.1 to 3 µm. If the film thickness is too small, particularly an ultraviolet-cured resin is likely to be insufficiently cured by the effect of oxygen and this is not preferred. In general, if the film thickness is excessively large, the cure shrinkage of an ultraviolet-cured resin involves flexure of the polymer substrate and in turn, curling is disadvantageously generated.

The surface unevenness of the cured resin layer is also affected by the film thickness and therefore, it is very important to control the film thickness. Particularly, in the case of the present invention, when only the film thickness is changed while keeping constant the amounts added of the metal oxide ultrafine particle A and the metal fluoride ultrafine particle B based on the cured resin component, as the film thickness is smaller, the surface unevenness becomes finer and the surface tends to be flattened, whereas as the film thickness is larger, the surface tends to be roughened.

Second Embodiment

In the second embodiment of the present invention, the film thickness of the cured resin layer with surface unevenness must be from 0.15 to 1.0 µm and is preferably from 0.15 to 0.9 µm, more preferably from 0.15 to 0.8 µm, still more preferably from 0.15 to 0.7 µm.

When such a film thickness is used in combination with the mass ratio (A/B) specified above with respect to the second embodiment of the present invention, a desired unevenness profile is formed and in turn, desired anti-Newton ring property, image sharpness and sparkling resistance are obtained. In general, if the film thickness is too small, the anti-Newton ring property tends to be reduced and this is not preferred. If the film thickness is excessively large, it is impossible to have a high image sharpness at wide angles.

Third Embodiment

In the third embodiment of the present invention, the film thickness of the cured resin layer with surface unevenness is preferably from 0.1 µm to less than 7 µm, more preferably from 1 µm to less than 7 µm. A relatively large film thickness of the cured resin layer is preferred because, for example, a cured resin layer having sufficient hardness is obtained or a material or the like generated from the base material is easily sealed with the cured resin layer.

In this respect, in the third embodiment of the present invention, when an unevenness formed by the first and second resin components is combined with an unevenness formed by a combination of the metal oxide ultrafine particle A and the metal fluoride ultrafine particle B, a transparent electroconductive laminate can ensures small unevenness pitch and thereby improves the image sharpness and sparkling resistance, even in a relatively large film thickness of, for example, 2 µm or more, 3 µm or more, or 4 µm or more.

<Cured Resin Layer—Other Components>

In the present invention, the surface unevenness of the cured resin layer is also dependent on the thixotropy of the ultrafine particle used. Therefore, for the purpose of developing or controlling the thixotropy, an appropriate solvent or dispersant may be selected and used when forming the cured resin layer. Examples of the solvent which can be used include various types such as alcohol type, aromatic type, ketone type, lactate type, cellosolve type and glycol type. Examples of the dispersant which can be used include various types such as fatty acid amine type, sulfonic acid amide type, ε-caprolactone type, hydrostearic acid type, polycarboxylic acid type and polyester amine. As for these solvents or dispersants, one kind may be used alone, or two or more kinds may be used in combination.

<Cured Resin Layer—Surface Unevenness>
(Ten-Point Average Roughness (Rz))

First Embodiment

In the first embodiment of the present invention, as regards the surface unevenness of the cured resin layer, the ten-point average roughness (Rz) is preferably from 300 nm to less than 1,500 nm, more preferably from 300 nm to less than 1,000 nm, still more preferably from 300 nm to less than 800 nm.

Second and Third Embodiments

In the second and third embodiments of the present invention, as regards the surface unevenness of the cured resin layer, the ten-point average roughness (Rz) is preferably from 50 nm to less than 2,000 nm, more preferably from 100 nm to less than 1,000 nm, still more preferably from 100 nm to less than 800 nm, and most preferably from 100 nm to less than 500 nm.

If the ten-point average roughness (Rz) is too small, a Newton ring is generated when a glass or film substrate is strongly contacted with the uneven surface of the present invention, whereas if the ten-point average roughness (Rz) is excessively large, the haze is increased and use as a substrate particularly for displays is not preferred because, for example, when applied to a high-definition liquid crystal display, color separation of a pixel is produced to cause sparkling.

Incidentally, in the present invention, the ten-point average roughness (Rz) is the roughness defined in accordance with JIS B0601-1982. More specifically, the ten-point average roughness (Rz) is a value determined by an analog-type surface roughness meter, and this is a value defined as the sum of an average height of the highest to the fifth highest peaks and an average depth of the deepest to the fifth deepest valleys, in the cross-sectional curve (as-measured data) of a reference length. Here, the reference length is 0.25 mm.
(Arithmetic Average Roughness (Ra))

First Embodiment

In the first embodiment of the present invention, as regards the surface unevenness of the cured resin layer, the arithmetic average roughness (Ra) is preferably from 50 nm to less than 300 nm, more preferably from 50 nm to less than 200 nm, still more preferably from 50 nm to less than 150 nm.

Second and Third Embodiments

In the second and third embodiments of the present invention, as regards the surface unevenness of the cured resin layer, the arithmetic average roughness (Ra) is preferably from 2 nm to less than 200 nm, more preferably from 10 nm to less than 150 nm, still more preferably from 10 nm to less than 150 nm, yet still more preferably from 20 nm to less than 100 nm, and most preferably from 20 nm to less than 60 nm.

If the arithmetic average roughness (Ra) is too small, a Newton ring is generated when a glass or film substrate is strongly contacted with the uneven surface of the present invention, whereas if the arithmetic average roughness (Ra) is excessively large, the haze is increased and use as a substrate particularly for displays is not preferred because, for example, when applied to a high-definition liquid crystal display, color separation of a pixel is produced to cause sparkling.

Incidentally, in the present invention, the arithmetic average roughness (centerline average roughness) (Ra) is the roughness defined in accordance with JIS B0601-1994. More specifically, a portion of a reference length L is extracted from a roughness curve in a centerline direction thereof, the centerline of the extracted portion is taken as axis X, the axial magnification direction is taken as axis Y, the roughness curve is represented by $y=f(x)$, and on these conditions, the arithmetic average roughness (Ra) is represented by the following formula:

$$R_d = \frac{1}{L}\int_0^L |f(x)|dx$$

<Cured Resin Layer—Haze>

In the cured resin layer with an uneven surface of the present invention, Rz, Ra and further, the haze can be freely controlled by changing the parameters such as solvent, dispersant, amounts added of metal oxide ultrafine particle A and/or metal fluoride ultrafine particle B, film thickness of cured resin layer, and amounts added of first and second resin components in the case of using at least two kinds of cured resin components undergoing phase separation.

In view of visibility, the haze of the electroconductive laminate of the present invention is preferably from 1% to less than 10%, more preferably from 1% to less than 8%, still more preferably from 1% to less than 7%, yet still more preferably from 1% to less than 6%.

Incidentally, in the present invention, the haze is the haze defined in accordance with JIS K7136. Specifically, the haze is a value defined as the ratio of the diffuse transmittance $\tau_d$ to the total light transmittance $\tau_t$ and, more specifically, can be determined according to the following formula:

Haze (%)=$[(\tau_4/\tau_2)-\tau_3(\tau_2/\tau_1)]\times 100$ wherein $\rho_1$: the luminous flux of incident light, $\tau_2$: the total luminous flux transmitted through the test piece, $\tau_3$: the luminous flux diffused in the apparatus, and $\tau_4$: the luminous flux diffused in the apparatus and the test piece.

<Cured Resin Layer—Image Sharpness>

In the second and third embodiments of the present invention, the cured resin layer may be formed so that the electroconductive laminate of the present invention can satisfy the following formulae (1) and (2) regarding the image sharpness:

70%≤α≤98%, preferably 75%≤α≤95%, more preferably 77%≤α≤95%, still more preferably 80%≤α≤93% (1)

0.50<β/α<1.05, preferably 0.80≤β/α<1.05, more preferably 0.85<β/α<1.05, still more preferably 0.90<β/α<1.05  (2)

(wherein

α: the transmitted image sharpness with incident light at the vertical incident angle when an optical comb of 2.0 mm is used, and β: the transmitted image sharpness with incident light at an incident angle of 60° when an optical comb of 2.0 mm is used).

The transmitted image sharpness above can be measured as a transmitted image sharpness (%) when using an optical comb of 2.0 mm, in accordance with JIS K7105 (1999).

Satisfying the relationship of formula (1) means that when the transparent electroconductive film is placed on a display, the distortion of a transmitted image viewed from a vertical direction is small. Also, satisfying the relationship of formula (2) in addition to that of formula (1) means that when the transparent electroconductive film is placed on a display, the distortion of a transmitted image viewed from vertical and oblique directions is small.

<Cured Resin Layer—Formation Method>

As the method for forming the cured resin layer with an uneven surface for use in the present invention, formation by a wet process is preferred, and all known methods such as doctor knife, bar coater, gravure roll coater, curtain coater, knife coater, spin coater, spray method and immersion method can be used.

<Transparent Electroconductive Layer>

In the present invention, the transparent electroconductive layer is not particularly limited but includes, for example, a crystalline metal layer and a crystalline metal compound layer. As for the component constituting the transparent electroconductive layer, the layer is composed of, for example, a metal oxide such as silicon oxide, aluminum oxide, titanium oxide, magnesium oxide, zinc oxide, indium oxide and tin oxide. Above all, a crystalline layer composed of indium oxide as a main component is preferred, and a layer composed of crystalline ITO (indium tin oxide) is more preferably used.

Also, in the case where the transparent electroconductive layer is crystalline, the upper limit of the crystal grain size need not be specifically set but is preferably 3,000 nm or less. If the crystal grain size exceeds 3,000 nm, writing durability is disadvantageously impaired. The crystal grain size as used herein is defined as a maximum diagonal or diameter out of diagonals or diameters in respective polygonal or oval regions observed through a transmission electron microscope (TEM).

In the case where the transparent electroconductive layer is not a crystalline film, sliding durability or environmental reliability required of a touch panel may be deteriorated.

The transparent electroconductive layer can be formed by a known technique and, for example, a physical vapor deposition (hereinafter, referred to as "PVD") method such as DC magnetron sputtering method, RF magnetron sputtering method, ion plating method, vacuum deposition method and pulsed laser deposition method may be used, but in view of industrial productivity of forming a metal compound layer with a uniform thickness for a large area, a DC magnetron sputtering method is preferred. Incidentally, other than the above-described physical vapor deposition (PVD) method, a chemical formation method such as chemical vapor deposition (hereinafter, referred to as "CVD") method and sol-gel method may be used, but in view of thickness control, a sputtering method is preferred after all.

In view of transparency and electrical conductivity, the film thickness of the transparent electroconductive layer is preferably from 5 to 50 nm, more preferably from 5 to 30 nm. If the film thickness of the transparent electroconductive layer is less than 5 nm, the aging stability of the resistance value tends to be poor, whereas if it exceeds 50 nm, the surface resistance value lowers and this is not preferred as a touch panel.

In the case of using the transparent electroconductive laminate of the present invention for a touch panel, from the standpoint of, for example, reducing the power consumption of the touch panel and necessarily experiencing a circuit processing, it is preferred to use a transparent electroconductive layer showing a surface resistance value of 100 to 2,000 Ω/sq, more preferably from 140 to 1,000 Ω/sq, when the film thickness of the transparent electroconductive layer is from 10 to 30 nm.

<Metal Compound Layer>

The transparent electroconductive laminate of the present invention may further contain a metal compound layer having a film thickness of 0.5 nm to less than 5.0 nm, between the cured resin layer with an uneven surface and the transparent electroconductive layer.

The transparent organic polymer substrate, the cured resin layer with an uneven surface, the metal compound layer with a controlled film thickness and the transparent electroconductive layer are stacked in order, whereby the adherence between respective layers is greatly improved. Furthermore, when the metal of the metal oxide ultrafine particle A and/or metal fluoride ultrafine particle B in the cured resin layer and the metal of the metal compound layer are the same, the adherence between the cured resin layer with an uneven surface and the transparent electroconductive layer is more improved.

In a transparent touch panel using the transparent electroconductive laminate having such a metal compound layer, compared with that having no metal compound layer, the writing durability required of the transparent touch panel is enhanced. If the film thickness of the metal compound layer is 5.0 nm or more, the metal compound layer starts showing mechanical properties as a continuous body and in turn, the edge-pressing durability required of the transparent touch panel cannot be enhanced. On the other hand, if the film thickness is less than 0.5 nm, control of the film thickness is difficult and in addition, sufficient adherence between the cured resin layer with an uneven surface and the transparent electroconductive layer can be hardly developed, as a result, the writing durability required of the transparent touch panel is insufficiently improved.

As for the component constituting the metal compound layer, the layer includes, for example, a layer composed of a metal oxide such as silicon oxide, aluminum oxide, titanium oxide, magnesium oxide, zinc oxide, indium oxide and tin oxide.

The metal compound layer can be formed by a known technique and, for example, a physical vapor deposition (PVD) method such as DC magnetron sputtering method, RF magnetron sputtering method, ion plating method, vacuum deposition method and pulsed laser deposition method may be used, but in view of industrial productivity of forming a metal compound layer with a uniform thickness for a large area, a DC magnetron sputtering method is preferred. Incidentally, other than the above-described physical vapor deposition (PVD) method, a chemical formation method such as chemical vapor deposition (CVD) method and sol-gel method may be used, but in view of thickness control, a sputtering method is preferred after all.

The target used for sputtering is preferably metal, and use of a reactive sputtering method is widely employed. Since, the oxide of an element used as the metal compound layer is mostly an insulator and therefore, a DC magnetron sputtering method cannot be applied in many cases in the case of a metal compound target. Also, in recent years, a power source capable of causing two cathodes to simultaneously discharge and thereby suppressing formation of an insulator on a target has been developed, and a pseudo RF magnetron sputtering method is becoming applicable.

<Optical Interference Layer and Hardcoat Layer>

In the transparent electroconductive laminate of the present invention, an optical interference layer capable of controlling the reflectance by optical interference and a hardcoat layer can be used each as a single layer or a plurality of layers in an appropriate order according to usage, if desired. The order of stacking the transparent electroconductive layer, the optical interference layer and the hardcoat layer is not particularly limited as long as the function expected to be developed according to usage is fulfilled, but, for example, in the case of use as a touch panel substrate, assuming that the transparent electroconductive layer is A, the optical interference layer is B, the cured resin layer with an uneven surface is C, the transparent organic polymer substrate is D and the hardcoat is E, examples of the stacking order include A/B/C/D/E, A/B/C/D/C, A/B/B/C/D/E, A/B/B/C/D/C, A/C/D/E/B, A/C/D/C/B, A/C/D/E/B/B, A/C/D/C/B/B, B/A/C/D/E, and B/A/C/D/C.

The optical interference layer indicates a layer capable of preventing or suppressing reflected light by appropriately combining a high refractive index layer and a low refractive index layer. The optical interference is composed of at least one high refractive index layer and at least one low refractive index layer. The optical interference layer may also be composed of two or more combination units of a high refractive index layer and a low refractive index layer. In the case where the optical interference layer is composed of one high refractive index layer and one low refractive index layer, the film thickness of the optical interference layer is preferably from 30 to 150 nm, more preferably from 50 to 150 nm. The optical interference layer may be formed by either method of a wet process and a dry process. Examples of the wet process which can be applied include a doctor knife, a bar coater, a gravure roll coater, a curtain coater, a knife coater, a spin coater, a spray method and an immersion method, and examples of the dry process which can be applied include a PVD method such as sputtering method, vacuum deposition method and ion plating method, a printing method and a CVD method.

As the hardcoat layer, a thermosetting resin, an activation energy ray-curable resin and the like are applicable. Among these, an ultraviolet-curable resin by using an ultraviolet ray for the activation energy is excellent in productivity and profitability and is preferred.

Examples of the ultraviolet-curable resin for the hardcoat layer include diacrylates such as 1,6-hexanediol diacrylate, 1,4-butanediol diacrylate, ethylene glycol diacrylate, diethylene glycol diacrylate, tetraethylene glycol diacrylate, tripropylene glycol diacrylate, neopentyl glycol diacrylate, 1,4-butanediol dimethacrylate, poly(butanediol)diacrylate, tetraethylene glycol dimethacrylate, 1,3-butylene glycol diacrylate, triethylene glycol diacrylate, triisopropylene glycol diacrylate, polyethylene glycol diacrylate and bisphenol A dimethacrylate; triacrylates such as trimethylolpropane triacrylate, trimethylolpropane trimethacrylate, pentaerythritol monohydroxy triacrylate and trimethylolpropane triethoxy triacrylate; tetraacrylates such as pentaerythritol tetraacrylate and ditrimethylolpropane tetraacrylate; and pentaacrylates such as dipentaerythritol (monohydroxy)pentaacrylate. As the ultraviolet-curable resin for the hardcoat layer, in addition, a pentafunctional or higher polyfunctional acrylate can be also used. One of these polyfunctional acrylates may be used alone, or two or more thereof may be mixed and used at the same time. Furthermore, these acrylates may be used after adding thereto one kind or two or more kinds of third components such as photoinitiator, photosensitizer, leveling agent and fine or ultrafine particle composed of a metal oxide, acrylic component or the like.

<Use>

In a transparent touch panel comprising two transparent electrode substrates each having a transparent electroconductive layer provided on at least one surface, which are disposed by arranging respective transparent electroconductive layers to face each other, the transparent electroconductive laminate of the present invention can be used as a transparent electrode substrate for movable and/or fixed electrode substrates.

EXAMPLES

The present invention is described in greater detail below by referring to Examples, but the present invention is not limited to these Examples. In the Examples, unless otherwise indicated, the "parts" and "%" are on the mass basis. Also, various measurements in Examples were performed as follows.

<Ra (Arithmetic Average Roughness)>

This was measured using a stylus profilometer, DEKTAK 3, manufactured by Sloan. The measurement was performed in accordance with JIS B0601-1994.

<Rz (Ten-Point Average Roughness)>

This was measured using Surfcorder SE-3400 manufacture by Kosaka Laboratory Ltd. The measurement was performed in accordance with JIS B0601-1982.

<Thickness>

The measurement was performed using a stylus thickness meter, Alpha Steck, manufactured by Anritsu Electric Co., Ltd.

<Haze>

This was measured using a haze meter (MDH2000) manufactured by Nippon Denshoku Industries Co., Ltd.

<Total Light Transmittance>

This was measured using a haze meter (MDH2000) manufactured by Nippon Denshoku Industries Co., Ltd. in accordance with JIS K7316-1.

<Anti-Newton Ring Property>

Two sheets of each sample of Examples and Comparative Examples were used as a movable electrode substrate and a fixed electrode substrate, respectively, and under a three-band fluorescent lamp, the presence or absence of a Newton ring was observed with an eye from a direction 60° inclined with respect to the surface of the touch panel (vertical direction, 0°), in a region where the substrates were put into contact. The sample was rated good (A) when a Newton ring was not observed, rated fair (B) when slightly observed, or rated bad (C) when clearly observed.

<Sparkling Property—123 dpi>

In Example A and Comparative Example A, a touch panel was installed on a liquid crystal display of about 123 dpi (10.4 inches diagonal, XGA (1,024×768 dots)), and the presence or absence of sparkling was observed with an eye. The sample was rated good (A) when sparkling was not recognized, rated fair (B) when slightly recognized, or rated bad (C) when clearly recognized.

<Sparkling Resistance—183 dpi and 333 dpi>

In Example B and Comparative Example B and in Example C and Comparative Example C, a touch panel was installed on a liquid crystal display of about 183 dpi (2.7 inches diagonal, WQVGA (240×432 dots)), and the presence or absence of sparkling was observed with an eye. The sample was rated good (A) when sparkling was not recognized, rated fair (B) when slightly recognized, or rated bad (C) when clearly recognized. Furthermore, the sample not allowing sparkling to be recognized even when the touch panel was installed on a liquid crystal display of about 333 dpi (2.8 inches diagonal, WVGA (480×800 dots)), was rated best (AA).

<Image Sharpness (Transmission Method)—0.5 mm or 2.0 mm>

The measurement was performed using ICM-1T manufactured by Suga Test Instruments Co., Ltd. in accordance with JIS K7105 (1999). In the measurement, the transmitted image sharpness (%) when using an optical comb of 0.5 mm (Example A and Comparative Example A) or an optical comb of 2.0 mm (Example B and Comparative Example B, and Example C and Comparative Example C) was measured.

Example A and Comparative Example A

In the following, it is demonstrated that, by using a metal oxide ultrafine particle and a metal fluoride ultrafine particle mixed in a specific ratio, a weakly aggregated state is created in the cured resin layer and a desired unevenness profile is thereby formed.

Example A1

A polycarbonate film (C110-100, produced by Teijin Chemicals, Ltd.) (PC) was used for the transparent organic polymer substrate, and Coating Solution $R_A$ having the following composition was coated by a wire bar on one surface of the film, dried by heating at 40° C. for 1 minute and then irradiated with an ultraviolet ray of 120 mW/cm$^2$ and 400 mJ/cm$^2$ by means of an ultraviolet lamp to form a cured resin layer with an uneven surface having a film thickness of about 1.5 μm.

Composition of Coating Solution $R_4$:

Tetrafunctional acrylate: 100 parts by mass ("ARONIX" M-405, produced by Toagosei Co., Ltd.)

Dispersion liquid of metal oxide ultrafine particle: 80 parts by mass (8 parts by mass in terms of solid content, produced by C. I. Kasei Company, Limited, a 10 mass % isopropyl alcohol dispersion liquid of $SiO_2$ ultrafine particle, average primary particle diameter of ultrafine particle: 30 nm)

Dispersion liquid of metal fluoride ultrafine particle: 20 parts by mass (4 parts by mass in terms of solid content, produced by C. I. Kasei Company, Limited, a 20 mass % isopropyl alcohol dispersion liquid of $MgF_2$ ultrafine particle, average primary particle diameter of ultrafine particle: 50 nm)

Photoreaction initiator: 5 parts by mass ("Irgacure" 184, produced by Ciba Specialty Chemicals Corp.)

Diluent: an appropriate amount (isobutyl alcohol)

Subsequently, an amorphous transparent electroconductive layer (ITO layer) was formed on the surface where the cured resin layer was formed, by a sputtering method using an indium oxide-tin oxide target having a composition of indium oxide and tin oxide in a mass ratio of 95:5 and having a filling density of 98%. The thickness of the ITO layer was about 20 nm, and the surface resistance value was about 370 Ω/sq.

Furthermore, a heat treatment was performed at 130° C. for 90 minutes to crystallize the transparent electroconductive layer (ITO layer), whereby a transparent electroconductive laminate was produced. The surface resistance value of the transparent electroconductive layer after crystallization of the ITO layer was about 450 Ω/sq. Incidentally, the crystal grain size of the transparent electroconductive layer observed by TEM was from 50 to 200 nm. The characteristics of the transparent electroconductive laminate produced are shown in Table 1.

(Confirmation of Dispersed State of Ultrafine Particles)

Figure 1:
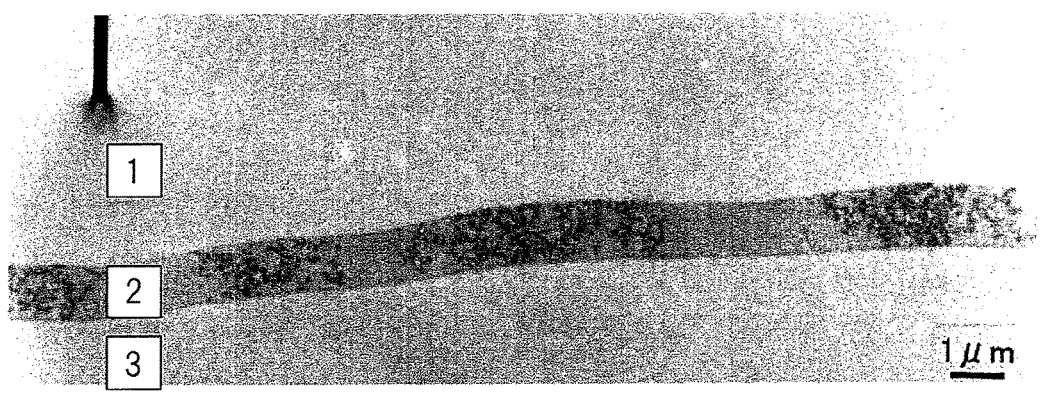
[FIG. 1] A cross-sectional photograph of a polymer substrate with a cured resin layer having an uneven surface formed in Example A1, which is taken by a transmission electron microscope after the substrate is embedded in a cured resin and cut using a microtome into a thin sample.
Figure 2:
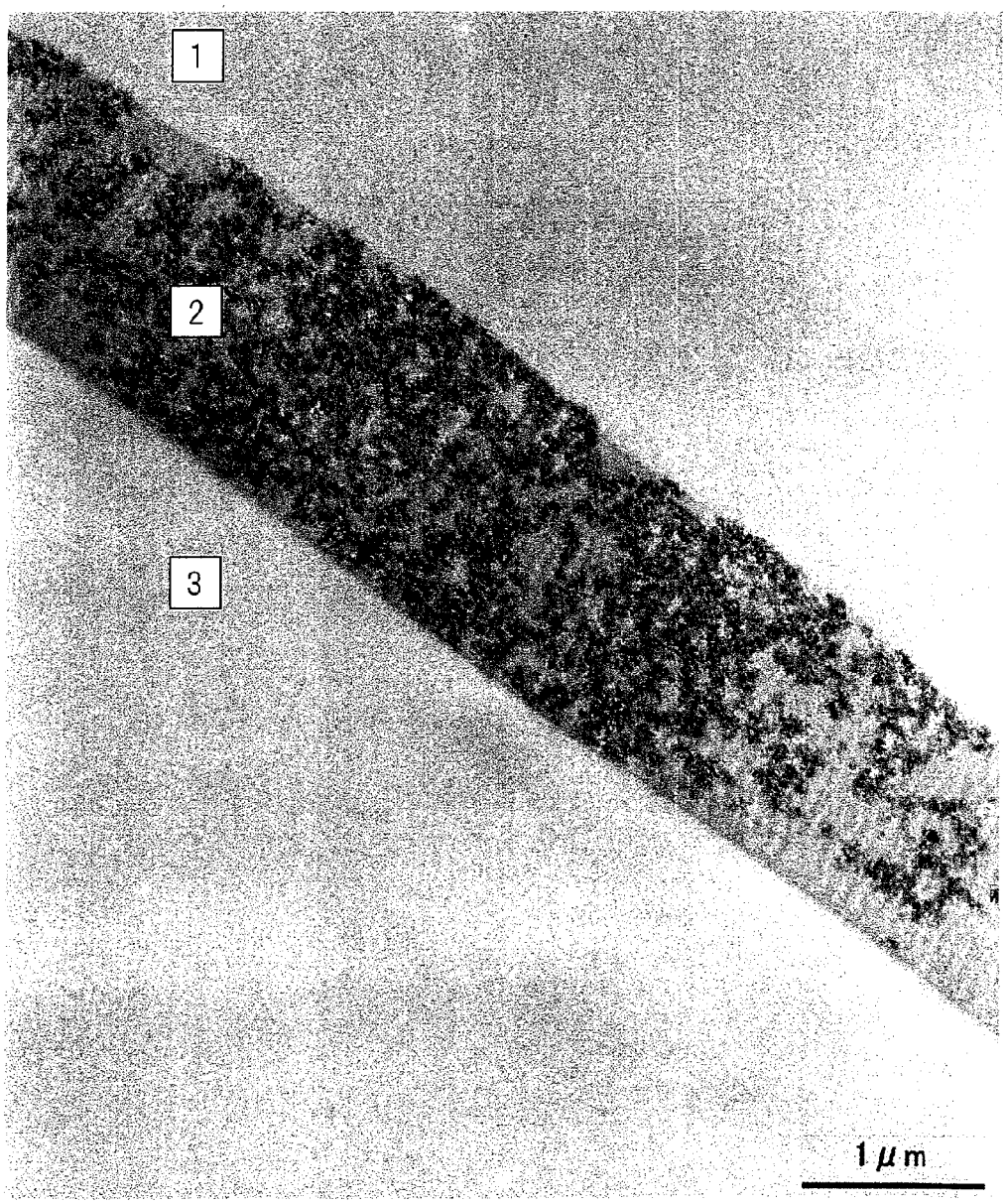
[FIG. 2] A cross-sectional photograph further zoomed in the cured resin layer containing ultrafine particles and having an uneven surface of FIG. 1.

In order to confirm the dispersed state of ultrafine particles, a polymer substrate with a cured resin layer having an uneven surface, prepared as in Example A1, was embedded in an epoxy resin and after the epoxy resin was completely cured, sliced with a microtome to prepare a section sample. This sample was observed through a transmission electron microscope. FIGS. 1 and 2 show the results. From these results, it was confirmed that ultrafine particles did not form a secondary aggregate particle of 1 μm or more and created an uneven surface due to the difference of sparse or dense.

Figure 4:
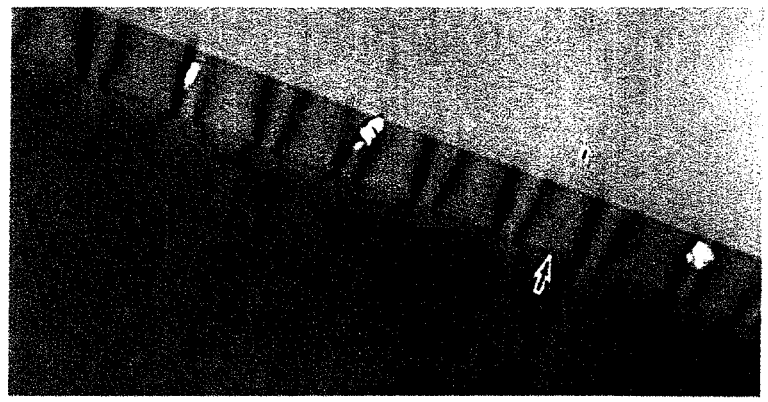
[FIG. 4] A transmission electron micrograph corresponding to FIG. 1 with respect to the cured resin layer obtained by mixing only $MgF_2$ ultrafine particles in an ultraviolet-cured resin.
Figure 5:
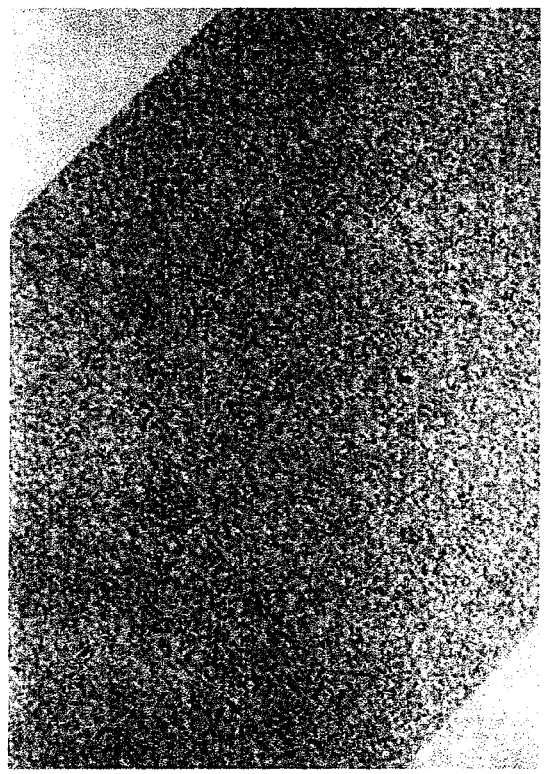
[FIG. 5] A transmission electron micrograph corresponding to FIG. 2 with respect to the cured resin layer obtained by mixing only $MgF_2$ ultrafine particles in an ultraviolet-cured resin.

For reference, FIGS. 4 and 5 show corresponding transmission electron microscope (TEM) photographs of the cured resin layer obtained by mixing only the $MgF_2$ ultrafine particle with the ultraviolet-cured resin.

Examples A2 to A5

As shown in Table 1, transparent electroconductive laminates of Examples A2 to A5 were obtained in the same manner as in Example A1 except for changing the amount used of the dispersion liquid of metal oxide ultrafine particle, the amount used of the dispersion liquid of metal fluoride ultrafine particle, and/or the thickness of the cured resin layer. The characteristics of each of the transparent electroconductive laminates produced are shown in Table 1.

Example A6

A transparent electroconductive laminate was obtained in the same manner as in Example A1 except for using a 188 μm-thick polyethylene terephthalate film (OFW, produced by Teijin DuPont Films Japan Limited) (PET) in place of the polycarbonate film (PC) of Example A1. The characteristics of the produced transparent electroconductive laminate are shown in Table 1.

Comparative Example A1

A transparent electroconductive laminate was obtained in the same manner as in Example A1 except for changing the amount of the dispersion liquid of metal oxide ultrafine particle of Example A1 to 10 parts by mass (1 parts by mass in terms of solid content) and changing the amount of the dispersion liquid of metal fluoride ultrafine particle to 20 parts by mass (4 parts by mass in terms of solid content). The characteristics of the produced transparent electroconductive laminate are shown in Table 1.

Comparative Example A2

A transparent electroconductive laminate was obtained in the same manner as in Example A1 except for changing the amount of the dispersion liquid of metal oxide ultrafine particle of Example A1 to 150 parts by mass (15 parts by mass in terms of solid content) and not using the dispersion liquid of metal fluoride ultrafine particle. The characteristics of the produced transparent electroconductive laminate are shown in Table 1.

Comparative Example A3

A transparent electroconductive laminate was obtained in the same manner as in Example A1 except for not using the dispersion liquid of metal oxide ultrafine particle. The characteristics of the produced transparent electroconductive laminate are shown in Table 1.

Comparative Example A4

A transparent electroconductive laminate was obtained in the same manner as in Example A1 except for using 40 parts by mass of zinc oxide nano fine particle (4 parts by mass in terms of solid content, produced by C. I. Kasei Company, Limited, a 10 mass % isopropyl alcohol dispersion liquid of ZnO ultrafine particle, average primary particle diameter of ultrafine particle: 30 nm) in place of the metal fluoride ultrafine particle component of Example A1. The characteristics of the produced transparent electroconductive laminate are shown in Table 1.

Comparative Example A5

A transparent electroconductive laminate was obtained in the same manner as in Example A1 except for using 27 parts by mass of titanium oxide nano fine particle (4 parts by mass in terms of solid content, produced by C. I. Kasei Company, Limited, a 15 mass % isopropyl alcohol dispersion liquid of $TiO_2$ ultrafine particle, average primary particle diameter of ultrafine particle: 30 nm) in place of the metal fluoride ultrafine particle component of Example A1. The characteristics of the produced transparent electroconductive laminate are shown in Table 1.

Comparative Example A6

A transparent electroconductive laminate was obtained in the same manner as in Example A1 except for changing the metal oxide ultrafine particle component of Example A1 to silica particle having an average primary particle diameter of 3.0 μm, not using the metal fluoride ultrafine particle component, and changing the film thickness to 2 μm. The characteristics of the produced transparent electroconductive laminate are shown in Table 1.

mer substrate, and Coating Solution $R_B$ having the following composition was coated by a wire bar on one surface of the film, dried by heating at 40° C. for 1 minute and then irradiated with an ultraviolet ray of 120 mW/cm$^2$ and 400 mJ/cm$^2$ by means of an ultraviolet lamp to form a cured resin layer with an uneven surface having a film thickness of about 0.7 μm.

Composition of Coating Solution $R_B$:

Tetrafunctional acrylate: 100 parts by mass ("ARONIX" M-405, produced by Toagosei Co., Ltd.)

Dispersion liquid of metal oxide ultrafine particle: 80 parts by mass (8 parts by mass in terms of solid content, produced by C. I. Kasei Company, Limited, a 10 mass %

TABLE 1

|  |  | Example A1 | Example A2 | Example A3 | Example A4 | Example A5 | Example A6 | Comp. Ex. A1 | Comp. Ex. A2 | Comp. Ex. A3 | Comp. Ex. A4 | Comp. Ex. A5 | Comp. Ex. A6 |
|---|---|---|---|---|---|---|---|---|---|---|---|---|---|
| Cured resin component (parts by mass) | | 100 | 100 | 100 | 100 | 100 | 100 | 100 | 100 | 100 | 100 | 100 | 100 |
| Metal oxide ultrafine particle A (parts by mass) | SiO$_2$ (30 nm) | 8 | 2 | 4 | 12 | 8 | 8 | 1 | 15 | — | 8 | 8 | — |
| | ZnO$_2$ (30 nm) | — | — | — | — | — | — | — | — | — | 4 | — | — |
| | TiO$_2$ (30 nm) | — | — | — | — | — | — | — | — | — | — | 4 | — |
| Metal fluoride ultrafine particle B (parts by mass) | MgF$_2$ (50 nm) | 4 | 6 | 1 | 2 | 4 | 4 | 4 | — | 4 | — | — | — |
| Metal oxide fine particle (parts by mass) | SiO$_2$ (3.0 μm) | — | — | — | — | — | — | — | — | — | — | — | 8 |
| (A/B) | | 2.00 | 0.33 | 4.00 | 6.00 | 2.00 | 2.00 | 0.25 | — | — | — | — | — |
| Film thickness (μm) | | 1.5 | 1.5 | 1.5 | 1.5 | 5.0 | 1.5 | 1.5 | 3.0 | 3.0 | 1.5 | 1.5 | 2.0 |
| Base material | | PC | PC | PC | PC | PC | PET | PC | PC | PC | PC | PC | PC |
| Haze | | 4.1 | 1.4 | 2.6 | 0.8 | 8.2 | 7.8 | 0.4 | 0.3 | 0.3 | 6.7 | 9.2 | 3.7 |
| Roughness (Ra)(nm) | | 150 | 80 | 100 | 50 | 300 | 240 | 60 | 20 | 20 | 210 | 260 | 190 |
| Roughness (Rz)(nm) | | 900 | 400 | 900 | 300 | 1600 | 1300 | 250 | 50 | 50 | 1100 | 1300 | 1020 |
| Image sharpness (%) | | 64 | 76 | 51 | 82 | 38 | 36 | 87 | 95 | 97 | 16 | 13 | 7 |
| Sparkling Resistance (123 dpi) | | A | A | A | A | B | B | A | A | A | C | C | C |
| Anti-Newton ring property | | A | A | A | B | A | A | C | C | C | A | A | A |

As apparent from Table 1, the touch panels using the transparent electroconductive laminates of Examples A1 to A5 were excellent in the anti-Newton ring property, sparkling resistance and image sharpness thanks to formation of a desired unevenness profile resulting from the metal oxide ultrafine particle and the metal fluoride ultrafine particle creating a weakly aggregated state in the cured resin layer. On the other hand, the touch panels using the transparent electroconductive laminates of Comparative Examples A1 to A3 had good sparkling resistance but were inferior in the anti-Newton ring property. Also, the touch panels using the transparent electroconductive laminates of Comparative Examples A4 to A6 had good anti-Newton ring property but were inferior in the sparkling resistance.

Example B and Comparative Example B

In the following, it is demonstrated that, by using a metal oxide ultrafine particle and a metal fluoride ultrafine particle mixed in a specific ratio and setting the cured resin layer to a specific thickness, the metal oxide ultrafine particle and the metal fluoride ultrafine particle create a weakly aggregated state in the cured resin layer to form a desired unevenness profile and desired anti-Newton ring property, image sharpness and sparkling resistance are thereby obtained.

Example B1

A polycarbonate film (C110-100, produced by Teijin Chemicals, Ltd.) was used for the transparent organic polymer substrate, and Coating Solution $R_B$ having the following composition was coated by a wire bar on one surface of the film, dried by heating at 40° C. for 1 minute and then irradiated with an ultraviolet ray of 120 mW/cm$^2$ and 400 mJ/cm$^2$ by means of an ultraviolet lamp to form a cured resin layer with an uneven surface having a film thickness of about 0.7 μm.

isopropyl alcohol dispersion liquid of SiO$_2$ ultrafine particle, average primary particle diameter of ultrafine particle: 30 nm)

Dispersion liquid of metal fluoride ultrafine particle: 25 parts by mass (5 parts by mass in terms of solid content, produced by C. I. Kasei Company, Limited, a 20 mass % isopropyl alcohol dispersion liquid of MgF$_2$ ultrafine particle, average primary particle diameter of ultrafine particle: 50 nm)

Photoreaction initiator: 5 parts by mass ("Irgacure" 184, produced by Ciba Specialty Chemicals Corp.) Diluent: an appropriate amount (isobutyl alcohol)

Subsequently, an amorphous transparent electroconductive layer (ITO layer) was formed on the surface where the cured resin layer was formed, by a sputtering method using an indium oxide-tin oxide target having a composition of indium oxide and tin oxide in a mass ratio of 95:5 and having a filling density of 98%. The thickness of the ITO layer was about 20 nm, and the surface resistance value was about 370 Ω/sq.

Furthermore, a heat treatment was performed at 130° C. for 90 minutes to crystallize the transparent electroconductive layer (ITO layer), whereby a transparent electroconductive laminate was produced. The surface resistance value of the transparent electroconductive layer after crystallization of the ITO layer was about 450 Ω/sq. Incidentally, the crystal grain size of the transparent electroconductive layer observed by TEM was from 50 to 200 nm. The characteristics of the transparent electroconductive laminate produced are shown in Table 2.

As apparent from Table 2, the touch panel using the transparent electroconductive laminate of this Example was excellent in the image sharpness, 60°/0° image sharpness ratio, sparkling resistance and anti-Newton ring property.

Examples B2 to B10

As shown in Table 2, transparent electroconductive laminates of Examples B2 to B10 were obtained in the same manner as in Example B1 except for changing the amount used of the dispersion liquid of metal oxide ultrafine particle, the amount used of the dispersion liquid of metal fluoride ultrafine particle, the thickness of the cured resin layer, and/or the base material. The characteristics of each of the transparent electroconductive laminates produced are shown in Table 2.

Reference Examples B1 to B6

As shown in Table 3, transparent electroconductive laminates of Reference Examples B1 to B6 were obtained in the same manner as in Example B1 except for changing the amount used of the dispersion liquid of metal oxide ultrafine particle, the amount used of the dispersion liquid of metal fluoride ultrafine particle, the thickness of the cured resin layer, and/or the base material. The characteristics of each of the transparent electroconductive laminates produced are shown in Table 3.

Comparative Examples B1 to B5

As shown in Table 3, transparent electroconductive laminates of Comparative Examples B1 to B5 were obtained in the same manner as in Example B1 except for changing the amount used of the dispersion liquid of metal oxide ultrafine particle, the amount used of the dispersion liquid of metal fluoride ultrafine particle, the amount used of the metal oxide fine particle, the thickness of the cured resin layer, and/or the base material. The characteristics of each of the transparent electroconductive laminates produced are shown in Table 3.

Incidentally, the metal oxide fine particle used in Comparative Example B3 was silica ($SiO_2$) particle having an average primary particle diameter of 3.0 μm. In Comparative Example B4, 40 parts by mass of zinc oxide nano fine particle (4 parts by mass in terms of solid content, produced by C. I. Kasei Company, Limited, a 10 mass % isopropyl alcohol dispersion liquid of ZnO ultrafine particle, average primary particle diameter of ultrafine particle: 30 nm) was used in place of the metal fluoride ultrafine particle component of Example B1. In Comparative Example B5, 27 parts by mass of titanium oxide nano fine particle (4 parts by mass in terms of solid content, produced by C. I. Kasei Company, Limited, a 15 mass % isopropyl alcohol dispersion liquid of $TiO_2$ ultrafine particle, average primary particle diameter of ultrafine particle: 30 nm) was used in place of the metal fluoride ultrafine particle component of Example B1.

TABLE 2

|  |  | Example B1 | Example B2 | Example B3 | Example B4 | Example B5 | Example B6 | Example B7 | Example B8 | Example B9 | Example B10 |
|---|---|---|---|---|---|---|---|---|---|---|---|
| Cured resin component (parts by mass) | | 100 | 100 | 100 | 100 | 100 | 100 | 100 | 100 | 100 | 100 |
| Metal oxide ultrafine particle A (parts by mass) | $SiO_2$ (30 nm) | 8 | 7 | 8 | 7 | 5 | 8 | 7 | 8 | 4 | 5 |
| | ZnO (30 nm) | — | — | — | — | — | — | — | — | — | — |
| | $TiO_2$ (30 nm) | — | — | — | — | — | — | — | — | — | — |
| Metal fluoride ultrafine particle B (parts by mass) | $MgF_2$ (50 nm) | 5 | 5 | 5 | 5 | 5 | 5 | 5 | 4 | 8 | 5 |
| Metal oxide fine particle (parts by mass) | $SiO_2$ (3.0 μm) | — | — | — | — | — | — | — | — | — | — |
| (A/B) | | 1.6 | 1.4 | 1.6 | 1.4 | 1.0 | 1.6 | 1.4 | 2.0 | 0.5 | 1.0 |
| Film thickness (μm) | | 0.7 | 0.7 | 0.3 | 0.3 | 1.0 | 0.2 | 1.0 | 0.5 | 0.5 | 0.5 |
| Base material | | PC | PET | PC | PET | PC | PET | PC | PC | PC | PC |
| Haze | | 3.2 | 3.5 | 4.5 | 5.2 | 2.2 | 5.6 | 3.0 | 5.8 | 1.9 | 2.7 |
| Roughness (Ra)(nm) | | 50 | 40 | 30 | 30 | 80 | 30 | 100 | 40 | 40 | 50 |
| Roughness (Rz)(nm) | | 210 | 270 | 120 | 130 | 600 | 130 | 620 | 230 | 180 | 200 |
| Image sharpness (%) | | 85.7 | 83.7 | 89.7 | 88.9 | 76.8 | 94.4 | 75.2 | 85.8 | 94.3 | 83.2 |
| 60°/0° Image sharpness ratio | | 1.02 | 1.02 | 1.01 | 0.98 | 0.85 | 0.99 | 0.86 | 0.98 | 0.99 | 0.95 |
| Sparkling Resistance (183 dpi and 333 dpi) | | A | A | AA | AA | B | AA | B | A | AA | A |
| Anti-Newton ring property | | A | A | B | B | A | B | A | A | B | B |

TABLE 3

|  |  | Ref. Ex. B1 | Ref. Ex. B2 | Ref. Ex. B3 | Ref. Ex. B4 | Ref. Ex. B5 | Ref. Ex. B6 | Comp. Ex. B1 | Comp. Ex. B2 | Comp. Ex. B3 | Comp. Ex. B4 | Comp. Ex. B5 |
|---|---|---|---|---|---|---|---|---|---|---|---|---|
| Cured resin component (parts by mass) | | 100 | 100 | 100 | 100 | 100 | 100 | 100 | 100 | 100 | 100 | 100 |
| Metal oxide ultrafine | $SiO_2$ (30 nm) | 8 | 8 | 8 | 8 | 4 | 8 | 15 | — | — | 8 | 8 |
| | ZnO (30 nm) | — | — | — | — | — | — | — | — | — | 4 | — |

TABLE 3-continued

|  |  | Ref. Ex. B1 | Ref. Ex. B2 | Ref. Ex. B3 | Ref. Ex. B4 | Ref. Ex. B5 | Ref. Ex. B6 | Comp. Ex. B1 | Comp. Ex. B2 | Comp. Ex. B3 | Comp. Ex. B4 | Comp. Ex. B5 |
|---|---|---|---|---|---|---|---|---|---|---|---|---|
| particle A (parts by mass) | $TiO_2$ (30 nm) | — | — | — | — | — | — | — | — | — | — | 4 |
| Metal fluoride ultrafine particle B (parts by mass) | $MgF_2$ (50 nm) | 4 | 4 | 5 | 5 | 1 | 4 | — | 4 | — | — | — |
| Metal oxide fine particle (parts by mass) | $SiO_2$ (3.0 μm) | — | — | — | — | — | — | — | — | 8 | — | — |
| (A/B) |  | 2.0 | 2.0 | 1.6 | 1.6 | 4.0 | 2.0 | — | — | — | — | — |
| Film thickness (μm) |  | 1.5 | 1.5 | 0.1 | 1.5 | 1.5 | 5.0 | 3.0 | 3.0 | 2.0 | 1.5 | 1.5 |
| Base material |  | PC | PET | PET | PC | PC | PC | PC | PC | PC | PC | PC |
| Haze |  | 4.1 | 7.8 | 6 | 3.5 | 2.6 | 8.2 | 0.3 | 0.3 | 3.7 | 6.7 | 9.2 |
| Roughness (Ra)(nm) |  | 150 | 240 | 30 | 120 | 100 | 300 | 20 | 20 | 190 | 210 | 260 |
| Roughness (Rz)(nm) |  | 900 | 1300 | 110 | 670 | 900 | 1600 | 50 | 50 | 1020 | 1100 | 1300 |
| Image sharpness (%) |  | 65.9 | 50.9 | 97.5 | 67.3 | 51.0 | 38.1 | 95.3 | 99.4 | 79.0 | 16.2 | 13.3 |
| 60°/0° Image sharpness ratio |  | 0.51 | 0.56 | 0.99 | 0.52 | 0.47 | 0.51 | 0.97 | 1.00 | 0.39 | — | — |
| Sparkling Resistance (183 dpi and 333 dpi) |  | C | C | A | C | C | C | A | A | C | C | C |
| Anti-Newton ring property |  | A | A | C | A | A | A | C | C | A | A | A |

As apparent from Table 2, the transparent electroconductive laminates of Examples B2 to B10 were excellent in the image sharpness, 60°/0° image sharpness ratio, sparkling resistance and anti-Newton ring property. On the other hand, as apparent from Table 3, the transparent electroconductive laminates of Comparative Reference Examples B1 to B6 were inferior in at least any one of image sharpness, 60°/0° image sharpness ratio, sparkling resistance and anti-Newton ring property, and were not excellent in all of these properties at the same time.

Also, the transparent electroconductive laminates of Comparative Examples B1 and B2 had good sparkling resistance but were inferior in the anti-Newton ring property. The transparent electroconductive laminate of Comparative Example B3 had good anti-Newton ring property, but was inferior in the sparkling resistance and allowed for occurrence of color separation in a pixel when installed on a high-definition liquid crystal display. The transparent electroconductive laminates of Comparative Examples B4 and B5 had good anti-Newton ring property but were inferior in the sparkling resistance. This poor sparkling resistance is considered to be attributable to aggregation of nano particles.

Example C and Comparative Example C

In the following, it is demonstrated that, by using a metal oxide ultrafine particle and a metal fluoride ultrafine particle mixed in a specific ratio, the metal oxide ultrafine particle and the metal fluoride ultrafine particle create a weakly aggregated state in the cured resin layer to form a desired unevenness profile, and that, when the cured resin component constituting the cured resin layer contains at least two kinds of resin components undergoing phase separation based on the difference in physical properties, formation of the unevenness profile can be controlled and desired anti-Newton ring property, image sharpness and sparkling resistance are thereby obtained.

Example C1

(Formation of Cured Resin Layer)

The following Coating Solution $R_c$ was coated by a bar coating method on one surface of a 100 μm-thick carbonate (PC) film (C110, produced by Teijin Chemicals, Ltd.) (transparent substrate A, haze value: 0.11%), dried at 30° C. for 1 minute and then cured through irradiation with ultraviolet ray to form a cured resin layer having a thickness of 5.0 μm.

Composition of Coating Solution $R_c$:

First resin component: 4.5 parts by weight of an unsaturated double bond-containing acrylic copolymer (Sp value: 10.0, Tg: 92° C.)

Second resin component: 100 parts by weight of pentaerythritol triacrylate (Sp value: 12.7)

Dispersion liquid of metal oxide ultrafine particle: 80 parts by mass (8 parts by mass in terms of solid content, produced by C. I. Kasei Company, Limited, a 10 mass % isopropyl alcohol dispersion liquid of $SiO_2$ ultrafine particle, average primary particle diameter of ultrafine particle: 30 nm)

Dispersion liquid of metal fluoride ultrafine particle: 20 parts by mass (4 parts by mass in terms of solid content, produced by C. I. Kasei Company, Limited, a 20 mass % isopropyl alcohol dispersion liquid of $MgF_2$ ultrafine particle, average primary particle diameter of ultrafine particle: 50 nm)

Photopolymerization initiator: 7 parts by weight of Irgacure 184 (produced by Ciba Specialty Chemicals Corp.)

Solvent: isobutyl alcohol in an amount giving a solid content of 30 wt %

Incidentally, the unsaturated double bond-containing acrylic copolymer (Sp value: 10.0, Tg: 92° C.) as the first resin component was prepared as follows.

A mixture consisting of 171.6 g of isoboronyl methacrylate, 2.6 g of methyl methacrylate and 9.2 g of methylacrylic acid was mixed, and this mixed solution was added dropwise to 330.0 g of propylene glycol monomethyl ether heated to 110° C. under a nitrogen atmosphere in a 1,000 ml-volume reaction vessel equipped with a stirring blade, a nitrogen inlet tube, a condenser and a dropping funnel, simultaneously with 80.0 g of a propylene glycol monomethyl ether solution containing 1.8 g of tertiary butylperoxy-2-ethylhexanoate at a constant speed over 3 hours. Thereafter, the reaction was allowed to proceed at 110° C. for 30 minutes.

Subsequently, 17.0 g of a propylene glycol monomethyl ether solution containing 0.2 g of tertiary butylperoxy-2-ethylhexanoate was added dropwise, 5.0 g of a propylene glycol monomethyl ether solution containing 1.4 g of tetrabutylammonium bromide and 0.1 g of hydroquinone was added thereto, a solution containing 22.4 g of 4-hydroxybutyl acrylate glycidyl ether and 5.0 g of propylene glycol monomethyl ether was added dropwise over 2 hours with air bubbling, and the reaction was further allowed to proceed over 5 hours to obtain an unsaturated double bond-containing acrylic copolymer as the first component.

The unsaturated double bond-containing acrylic copolymer obtained had a number average molecular weight of 5,500, a weight average molecular weight of 18,000, an Sp value of 10.0, Tg of 92° C. and a surface tension of 31 dyn/cm.

Thereafter, an amorphous transparent electroconductive layer (ITO layer) was formed on the surface where the cured resin layer was formed, by a sputtering method using an indium oxide-tin oxide target having a composition of indium oxide and tin oxide in a mass ratio of 95:5 and having a filling density of 98%. The thickness of the ITO layer was about 20 nm, and the surface resistance value was about 370 Ω/sq.

Furthermore, a heat treatment was performed at 130° C. for 90 minutes to crystallize the transparent electroconductive layer (ITO layer), whereby a transparent electroconductive laminate was produced. The surface resistance value of the transparent electroconductive layer after crystallization of the ITO layer was about 450 Ω/sq. Incidentally, the crystal grain size of the transparent electroconductive layer observed by TEM was from 50 to 200 nm. The characteristics of the transparent electroconductive laminate produced are shown in Table 4.

Examples C2 and C3

Transparent electroconductive laminates were obtained in the same manner as in Example C1 except for changing the film thickness of the cured resin layer to 3.0 μm and 1.5 μm, respectively. The characteristics of each of the transparent electroconductive laminates produced are shown in Table 4.

Comparative Example C1

A transparent electroconductive laminate was obtained in the same manner as in Example C1 except for not adding both the dispersion liquid of metal oxide ultrafine particle and the dispersion liquid of metal fluoride ultrafine particle in the preparation of Coating Solution $R_c$. The characteristics of the transparent electroconductive laminate produced are shown in Table 4.

Comparative Example C2

A transparent electroconductive laminate was obtained in the same manner as in Example C1 except for not adding the dispersion liquid of metal oxide ultrafine particle in the preparation of Coating Solution $R_c$ and changing the film thickness of the cured resin layer to 3.0 μm. The characteristics of the transparent electroconductive laminate produced are shown in Table 4.

Comparative Examples C3 to C5

Transparent electroconductive laminates were obtained in the same manner as in Example C1 except for not adding the second resin component in the preparation of Coating Solution $R_c$ and changing the film thickness of the cured resin layer to 5 μm, 3 μm and 1.5 μm, respectively. The characteristics of each of the transparent electroconductive laminates produced are shown in Table 4.

TABLE 4

| | | Example C1 | Example C2 | Example C3 | Comparative Example C1 | Comparative Example C2 | Comparative Example C3 | Comparative Example C4 | Comparative Example C5 |
|---|---|---|---|---|---|---|---|---|---|
| Cured resin (parts by mass) | First resin component | 100 | 100 | 100 | 100 | 100 | 100 | 100 | 100 |
| | Second resin component | 4.5 | 4.5 | 8 | 4.5 | 4.5 | — | — | — |
| Metal oxide ultrafine particle A (parts by mass) | $SiO_2$ (30 nm) | 8 | 8 | 4 | — | — | 8 | 8 | 8 |
| Metal fluoride ultrafine particle B (parts by mass) | $MgF_2$ (50 nm) | 4 | 4 | — | — | 5 | 4 | 4 | 4 |
| (A/B) | | 2.0 | 2.0 | 2.0 | — | — | 2.0 | 2.0 | 2.0 |
| Film thickness (μm) | | 5.0 | 3.0 | 1.5 | 5.0 | 3.0 | 5.0 | 3.0 | 1.5 |
| Base material | | PC | PC | PC | PC | PC | PC | PC | PC |
| Haze | | 4.4 | 3.3 | 2.7 | 5.8 | 4.4 | 8.2 | 5.9 | 4.1 |
| Roughness (Ra)(nm) | | 70 | 40 | 40 | 140 | 110 | 300 | 210 | 150 |
| Roughness (Rz)(nm) | | 500 | 300 | 270 | 900 | 1100 | 1600 | 1300 | 900 |
| Image sharpness (%) | | 85.8 | 89.2 | 91.3 | 45.5 | 57.2 | 38.1 | 48.1 | 64.2 |
| 60°/0° Image sharpness ratio | | 0.99 | 1.02 | 1.01 | 0.73 | 0.68 | 0.51 | 0.46 | 0.51 |
| Sparkling Resistance (183 dpi and 333 dpi) | | A | A | A | C | C | C | C | C |
| Anti-Newton ring property | | A | A | B | A | A | A | A | A |

As apparent from Table 4, the touch panels using the transparent electroconductive laminates of Examples C1 to B3 had characteristics different from those of the touch panels using the transparent electroconductive laminates of Comparative Example C1 where both the dispersion liquid of metal oxide ultrafine particle and the dispersion liquid of metal fluoride ultrafine particle were not added, Comparative Example C2 where the dispersion liquid of metal oxide ultrafine particle was not added, and Comparative Examples C3 to C5 where the second resin component was not added. As apparent from Table 4, the touch panels using the transparent electroconductive laminates of Examples C1 to C3 were excellent in the anti-Newton ring property, sparkling resistance, 60°/0° image sharpness ratio, and image sharpness.

DESCRIPTION OF NUMERICAL REFERENCES

1 Embedding resin
2 Cured resin layer with an uneven surface containing ultrafine particles
3 Transparent organic polymer substrate
11 Substrate (glass plate)
12, 14 Transparent electroconductive layer
13 Spacer
15 Cured resin layer with an uneven surface
16 Transparent organic polymer substrate
20 Transparent touch panel

The invention claimed is:

1. A transparent electroconductive laminate, comprising a cured resin layer with an uneven surface and a transparent electroconductive layer stacked in order on at least one surface of a transparent organic polymer substrate and satisfying the following requirements (a) to (d) and (f):
  (a) said cured resin layer contains a cured resin component and contains a metal oxide ultrafine particle A having an average primary particle diameter of about 30 nm and a metal fluoride ultrafine particle B having an average primary particle diameter of about 50 nm, which are dispersed in said cured resin component, the metal oxide ultrafine particles and the metal fluoride ultrafine particles creating a weakly aggregated state in a cured resin layer to form an unevenness profile on the surface of said cured layer,
  (b) the content of the metal oxide ultrafine particle A in said cured resin layer is from about 2 parts by mass to about 8 parts by mass per 100 parts by mass of the cured resin component,
  (c) the content of the metal fluoride ultrafine particle B in said cured resin layer is from about 1 part by mass to about 6 parts by mass per 100 parts by mass of the cured resin component,
  (d) the mass ratio (A/B) of the metal oxide ultrafine particle A to the metal fluoride ultrafine particle B in said cured resin layer is from about 0.33 to about 4.00, and said cured resin layer has a thickness of about 0.7 µm to about 5.0 µm, and
  (f) said metal oxide ultrafine particle A is $SiO_2$, and said metal fluoride ultrafine particle B is $MgF_2$.

2. The transparent electroconductive laminate according to claim 1, wherein the ten-point average roughness (Rz) of said cured resin layer is from 300 nm to less than 1,500 nm, and the arithmetic average roughness (Ra) of said cured resin layer is from 50 nm to less than 300 nm.

3. The transparent electroconductive laminate according to claim 1, wherein the thickness of said cured resin layer is from about 0.7 µm to 4.5 µm.

4. The transparent electroconductive laminate according to claim 1, wherein
  (d) the mass ratio (A/B) of the metal oxide ultrafine particle A to the metal fluoride ultrafine particle B in said cured resin layer is from 1.0 to 2.0.

5. The transparent electroconductive laminate according to claim 4, satisfying the following formulae (1) and (2):

$$70\% \le \alpha \le 98\% \quad (1)$$

$$0.50 < \beta/\alpha < 1.05 \quad (2)$$

(wherein
  α: the transmitted image sharpness with incident light at the vertical incident angle when an optical comb of 2.0 mm is used, and
  β: the transmitted image sharpness with incident light at an incident angle of 60° when an optical comb of 2.0 mm is used).

6. The transparent electroconductive laminate according to claim 4, wherein the ten-point average roughness (Rz) of said cured resin layer is from 50 nm to less than 2,000 nm and the arithmetic average roughness (Ra) of said cured resin layer is from 2 nm to less than 200 nm.

7. The transparent electroconductive laminate according to claim 1, wherein
  (e) said cured resin component contains at least two kinds of resin components undergoing phase separation based on a difference in physical properties.

8. The transparent electroconductive laminate according to claim 7, wherein the film thickness of said cured resin layer is from 1 µm to about 5.0 µm.

9. The transparent electroconductive laminate according to claim 8, satisfying the following formulae (1) and (2):

$$70\% \le \alpha \le 98\% \quad (1)$$

$$0.50 < \beta/\alpha < 1.05 \quad (2)$$

(wherein
  α: the transmitted image sharpness with incident light at the vertical incident angle when an optical comb of 2.0 mm is used, and
  β: the transmitted image sharpness with incident light at an incident angle of 60° when an optical comb of 2.0 mm is used).

10. The transparent electroconductive laminate according to claim 7, satisfying the following formulae (1) and (2):

$$70\% \le \alpha \le 98\% \quad (1)$$

$$0.50 < \beta/\alpha < 1.05 \quad (2)$$

(wherein
  α: the transmitted image sharpness with incident light at the vertical incident angle when an optical comb of 2.0 mm is used, and
  β: the transmitted image sharpness with incident light at an incident angle of 60° when an optical comb of 2.0 mm is used).

11. The transparent electroconductive laminate according to claim 1, wherein the haze based on said transparent organic polymer substrate and said cured resin layer is from 1% to less than 10%.

12. The transparent electroconductive laminate according to claim 1, wherein said transparent electroconductive layer is a crystalline layer composed of indium oxide as a main component, and the thickness of said transparent electroconductive layer is from 5 to 50 nm.

13. The transparent electroconductive laminate according to claim 1, having, between said cured resin layer and said transparent electroconductive layer, a metal compound layer contacting with said transparent electroconductive layer and having a film thickness which is smaller than that of said transparent electroconductive layer and is from 0.5 nm to less than 5.0 nm.

14. The transparent electroconductive laminate according to claim 13, wherein the metal of said metal compound layer and the metal of said metal oxide ultrafine particle A or metal fluoride ultrafine particle B are the same.

15. A transparent touch panel, comprising two transparent electrode substrates each having a transparent electroconductive layer provided on at least one surface, which are disposed by arranging respective transparent electroconductive layers to face each other, wherein the transparent electroconductive laminate claimed in claim 1 is used as at least either one of the transparent electrode substrates.

16. The transparent electroconductive laminate according to claim 1, wherein the mass ratio (AB) of the metal oxide ultrafine particle A to the metal fluoride ultrafine particle B in said cured resin layer is from 1.0 to about 4.00.

17. A transparent electroconductive laminate according to claim 1, wherein the content of the metal fluoride ultrafine particle B in said cured resin layer is from about 1 part by mass to less than about 6 parts by mass per 100 parts by mass of the cured resin component.

18. A transparent electroconductive laminate according to claim 1, wherein:
   the content of the metal fluoride ultrafine particle B in said cured resin layer is from about 1 part by mass to less than about 6 parts by mass per 100 parts by mass of the cured resin component, and
   said cured resin layer has a thickness of about 1.5 μm to about 5.0 μm.

19. A transparent electroconductive laminate according to claim 1, wherein:
   the content of the metal oxide ultrafine particle A in said cured resin layer is about 8 parts by mass of the cured resin component,
   the content of the metal fluoride ultrafine particle B in said cured resin layer is about 4 parts by mass of the cured resin component,
   the mass ratio (A/B) of the metal oxide ultrafine particle A to the metal fluoride ultrafine particle B in said cured resin layer is about 2.0,
   said cured resin layer has a thickness of about 3.0 μm to about 5.0 μm, and
   said cured resin component contains at least two kinds of resin components undergoing phase separation based on a difference in physical properties.

20. A transparent electroconductive laminate, comprising a cured resin layer with an uneven surface and a transparent electroconductive layer stacked in order on at least one surface of a transparent organic polymer substrate and satisfying the following requirements (a) to (d) and (f):
   (a) said cured resin layer contains a cured resin component and contains a metal oxide ultrafine particle A having an average primary particle diameter of about 30 nm and a metal fluoride ultrafine particle B having an average primary particle diameter of about 50 nm, which are dispersed in said cured resin component, the metal oxide ultrafine particles and the metal fluoride ultrafine particles creating a weakly aggregated state in a cured resin layer to form an unevenness profile on the surface of said cured layer,
   (b) the content of the metal oxide ultrafine particle A in said cured resin layer is from about 5 parts by mass to less than about 8 parts by mass per 100 parts by mass of the cured resin component,
   (c) the content of the metal fluoride ultrafine particle B in said cured resin layer is from about 4 parts by mass to less than about 5 parts by mass per 100 parts by mass of the cured resin component,
   (d) the mass ratio (A/B) of the metal oxide ultrafine particle A to the metal fluoride ultrafine particle B in said cured resin layer is from about 1.0 to about 2.0, and said cured resin layer has a thickness of about 0.5 μm to about 1.0 μm, and
   (f) said metal oxide ultrafine particle A is $SiO_2$, and said metal fluoride ultrafine particle B is $MgF_2$.

* * * * *